United States Patent
Jung et al.

(10) Patent No.: US 10,607,682 B2
(45) Date of Patent: Mar. 31, 2020

(54) OPERATION CONTROL CIRCUIT AND SEMICONDUCTOR MEMORY DEVICE INCLUDING THE OPERATION CONTROL CIRCUIT

(71) Applicant: SK hynix Inc., Icheon-si, Gyeonggi-do (KR)

(72) Inventors: I Yeong Jung, Icheon-si (KR); Geun Il Lee, Yongin-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/189,590

(22) Filed: Nov. 13, 2018

(65) Prior Publication Data

US 2019/0318778 A1  Oct. 17, 2019

(30) Foreign Application Priority Data

Apr. 16, 2018 (KR) .................. 10-2018-0044036

(51) Int. Cl.
| | |
|---|---|
| *G11C 11/406* | (2006.01) |
| *G11C 11/4074* | (2006.01) |
| *G11C 7/10* | (2006.01) |
| *G11C 11/4096* | (2006.01) |
| *G11C 11/4093* | (2006.01) |

(52) U.S. Cl.
CPC ........ *G11C 11/40615* (2013.01); *G11C 7/109* (2013.01); *G11C 7/1063* (2013.01); *G11C 7/1084* (2013.01); *G11C 11/4074* (2013.01); *G11C 11/4093* (2013.01); *G11C 11/4096* (2013.01); *G11C 11/40607* (2013.01); *G11C 11/40626* (2013.01)

(58) Field of Classification Search
CPC .......... G11C 11/40615; G11C 11/4093; G11C 7/1063; G11C 7/1084; G11C 11/4096; G11C 7/109; G11C 11/4074; G11C 11/40626; G11C 11/40607; G11C 7/04
USPC ....................................................... 365/212
See application file for complete search history.

(56) References Cited

U.S. PATENT DOCUMENTS

| | | | |
|---|---|---|---|
| 9,251,890 B1 | 2/2016 | Agarwal et al. | |
| 9,281,048 B2* | 3/2016 | Kim .................. | G11C 11/40615 |
| 9,704,558 B2* | 7/2017 | Doo .................... | G11C 11/4091 |
| 9,798,469 B2* | 10/2017 | Kim ........................ | G06F 3/061 |
| 10,199,085 B2* | 2/2019 | Nomura ............ | G11C 11/40618 |
| 2008/0247256 A1* | 10/2008 | Kim ...................... | G11C 11/406 |
| | | | 365/222 |

* cited by examiner

*Primary Examiner* — Fernando Hidalgo
(74) *Attorney, Agent, or Firm* — William Park & Associates Ltd.

(57) ABSTRACT

A semiconductor memory device may include a control signal generation circuit, a period signal generation circuit and a selection circuit. The control signal generation circuit may be configured to generate a control signal in response to a mode signal, a voltage detection signal and a temperature detection signal. The period signal generation circuit may be configured to generate a period signal periodically transited in response to the control signal. The selection circuit may be configured to output, in response to the control signal, any one of the period signal and a signal from an external device that is buffered.

20 Claims, 3 Drawing Sheets

OPERATION CONTROL CIRCUIT AND SEMICONDUCTOR MEMORY DEVICE INCLUDING THE OPERATION CONTROL CIRCUIT

CROSS-REFERENCES TO RELATED APPLICATION

The present application claims priority under 35 U.S.C. § 119(a) to Korean application number 10-2018-0044036, filed on Apr. 16, 2018, in the Korean Intellectual Property Office, which is incorporated herein by reference in its entirety.

BACKGROUND

1. Technical Field

Various embodiments may generally relate to an operation control circuit, and more particularly, a semiconductor device including the operation control circuit.

2. Related Art

A semiconductor memory device may receive and store data. The semiconductor memory device may output the stored data.

In order to receive and output the data, the semiconductor memory device may receive a command from an external device. Further, the semiconductor memory device may receive an address for determining storage position of the inputted data and the outputted data.

As mentioned above, the semiconductor memory device may receive the above-mentioned various signals. The semiconductor memory device may perform internal operations in response to the inputted signals.

When the signals such as the command, the data, the address, etc., may not be inputted into the semiconductor memory device from the external device for a predetermined time, signals transmitted in the semiconductor memory device may be fixed to a specific level. When the signals transmitted/received in the semiconductor memory device may be fixed to the specific level with applying a power to the semiconductor memory device, that is, when the semiconductor memory device may not perform any operations, excessive stresses may apply to circuits for transmitting/receiving the fixed signals due to the power.

SUMMARY

In example embodiments of the present disclosure, a semiconductor memory device may include a control signal generation circuit, a period signal generation circuit and a selection circuit. The control signal generation circuit may be configured to generate a control signal in response to a mode signal, a voltage detection signal and a temperature detection signal. The period signal generation circuit may be configured to generate a period signal periodically transited in response to the control signal. The selection circuit may be configured to output, in response to the control signal, any one of the period signal and a signal from an external device that is buffered.

In example embodiments of the present disclosure, a semiconductor memory device may include a selection circuit. The selection circuit may be configured to output a periodically transited period signal in place of a signal from an external device that is buffered when a voltage level in a self-refresh operation is higher than a set voltage level and/or a temperature in the self-refresh operation is higher than a set temperature in a self-refresh operation.

In example embodiments of the present disclosure, an operation control circuit may include a control signal generation circuit and a period signal generation circuit. The control signal generation circuit may be configured to generate a control signal when a voltage in a self-refresh operation is higher than a set voltage and/or a temperature in the self-refresh operation is higher than a set temperature. The period signal generation circuit may be configured to generate a periodically transited period signal in response to the control signal.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
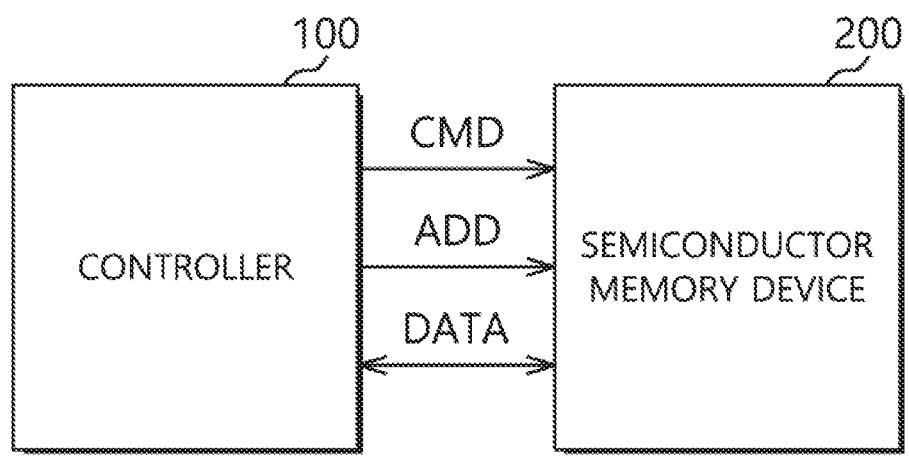
FIG. 1 is a view illustrating a system including a semiconductor memory device in accordance with example embodiments.

FIG. 1 is a view illustrating a system including a semiconductor memory device in accordance with example embodiments.

Referring to FIG. 1, a system may include a controller 100 and a semiconductor memory device 200.

In order to control the semiconductor memory device 200, the controller 100 may provide the semiconductor memory device 200 with a command CMD, an address ADD and data DATA. The controller 100 may receive the data DATA from the semiconductor memory device 200.

The semiconductor memory device 200 may receive the command CMD, the address ADD and the data DATA from the controller 100. The semiconductor memory device 200 may provide the controller 100 with the data DATA. For example, the semiconductor memory device 200 may store the data DATA in response to the command CMD and the address ADD. The semiconductor memory device 200 may output the stored data DATA in response to the command CMD and the address ADD.

The semiconductor memory device may perform other operations as well as the storage operation and the output operation in response to the command CMD from the controller 100. For example, the semiconductor memory device 200 may perform a standby mode, a power down mode, a refresh mode, etc., in response to the command CMD.

When the semiconductor memory device 200 may not receive signals such as the command CMD, the address ADD and the data DATA from the controller 100 for a predetermined time, the semiconductor memory device may periodically generate signals received/transmitted in the semiconductor memory device 200.

The word "predetermined" as used herein with respect to a parameter, such as a predetermined amount of time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter used in the process or algorithm.

Figure 2:
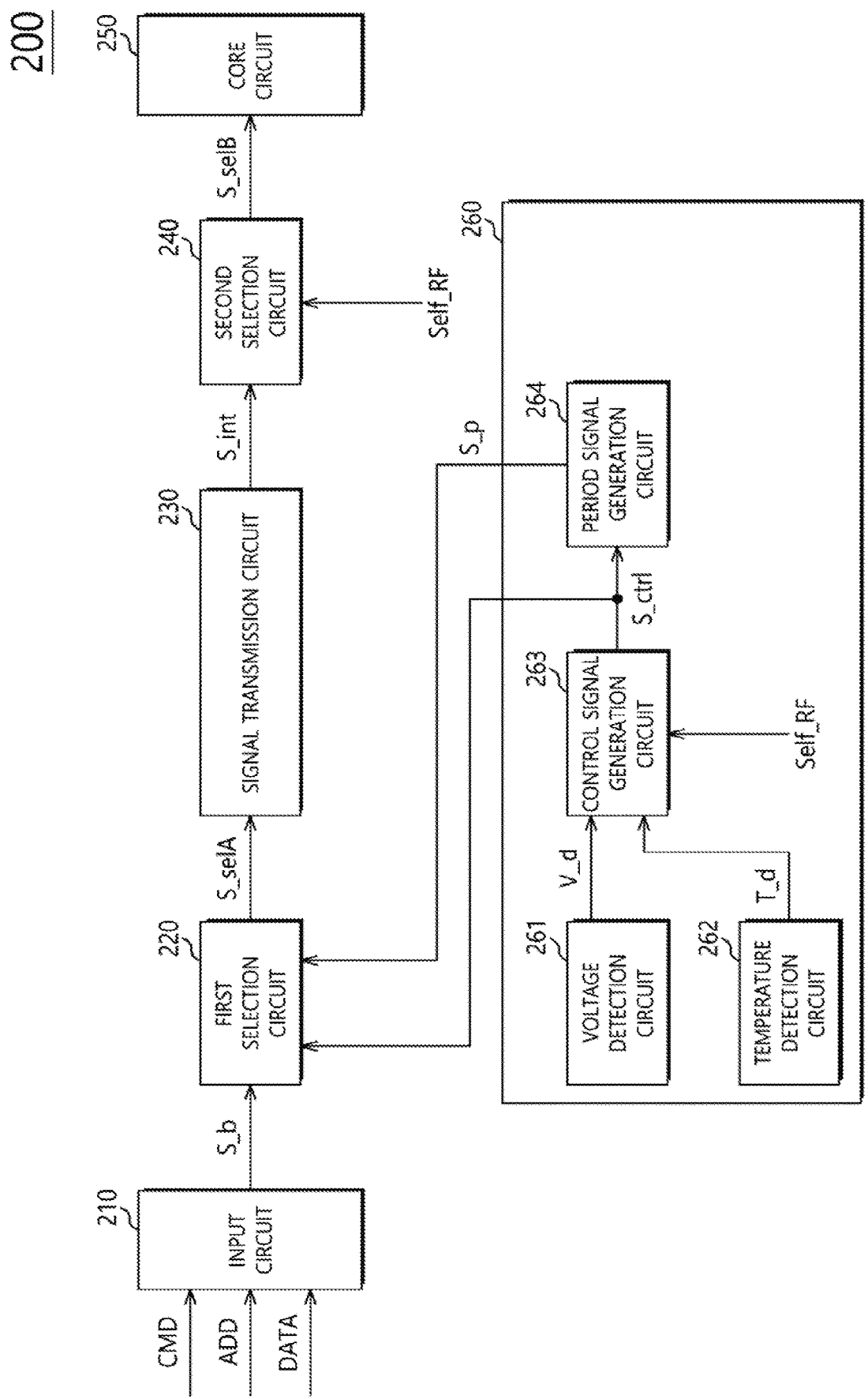
FIG. 2 is a view illustrating the semiconductor memory device in FIG. 1.

FIG. 2 is a view illustrating the semiconductor memory device in FIG. 1.

Referring to FIG. 2, the semiconductor memory device 200 may include an input circuit 210, a first selection circuit 220, a signal transmission circuit 230, a second selection circuit 240, a core circuit 250 and an operation control circuit 260.

The input circuit 210 may generate a buffering signal S_b in response to the command CMD, the address ADD and the data DATA. For example, the input circuit 210 may buffer the command CMD to generate the buffering signal S_b. The input circuit 210 may buffer the address ADD to generate the buffering signal S_b. The input circuit 210 may buffer the data DATA to generate the buffering signal S_b. The input circuit 210 may include at least one buffer. The buffering signal S_b may include at least one signal.

The first selection circuit 220 may output any one of the buffering signal S_b and a period signal S_p as a first selection signal S_selA in response to a control signal S_ctrl. For example, when the control signal S_ctrl is disabled, the first selection circuit 220 may output the buffering signal S_b as the first selection signal S_selA. When the control signal S_ctrl is enabled, the first selection circuit 220 may output the period signal S_p as the first selection signal S_selA. The first selection circuit 220 may include a multiplexer.

The signal transmission circuit 230 may output the first selection signal S_selA as an internal signal S_int. The signal transmission circuit 230 may transmit a signal from the input circuit 210 to the core circuit 250. The signal transmission circuit 230 may include at least one periphery circuit. The periphery circuit may include a driver, a buffer, a delay, a decoder, a comparator, etc.

The second selection circuit 240 may output the internal signal S_int as a second selection signal S_selB or fix the second selection signal S_selB to a specific level in response to a mode signal Self_RF. For example, when the mode signal Self_RF may be disabled, the second selection circuit 240 may provide the core circuit 250 with the internal signal S_int as the second selection signal S_selB. When the mode signal Self_RF may be enabled, the second selection circuit 240 may fix the second selection signal S_selB to the specific level, for example, a low level, regardless of the internal signal S_int. The second selection circuit 240 may provide the core circuit 250 with the fixed second selection signal S_selB. The mode signal Self_RF may correspond to a signal generated in the semiconductor memory device 200 when the command CMD, the address ADD and the data DATA may not be inputted into the semiconductor memory device 200 for a predetermined time. Alternatively, the mode signal Self_RF may correspond to a signal transmitted from the controller 100. The enabled mode signal Self_RF may be generated from the controller 100 when the signal may not be inputted into the semiconductor memory device 200 for a predetermined time. In example embodiments, the mode signal Self_RF may include a self-refresh signal or a power down signal. Alternatively, the mode signal Self_RF may include signals different from the refresh and power down signals.

The core circuit 250 may store and output the data DATA in response to the second selection signal S_selB. For example, the core circuit 250 may include at least one memory cell for storing the data DATA. The core circuit 250 may include a memory cell array having a plurality of the memory cells.

When the mode signal Self_RF is enabled and either a voltage level used in the semiconductor memory device 200 is higher than a set level or a temperature in the semiconductor memory device 200 is higher than a set value, the operation control circuit 260 may enable the control signal S_ctrl. When the control signal S_ctrl is enabled, the operation control circuit 260 may output the period signal S_p. For example, when the control signal S_ctrl is enabled, the operation control circuit 260 may generate the periodically transited period signal S_p.

The operation control circuit 260 may include a voltage detection circuit 261, a temperature detection circuit 262, a control signal generation circuit 263 and a period signal generation circuit 264.

When the voltage used in the semiconductor memory device 200 is higher than the set voltage level, the voltage detection circuit 261 may enable a voltage detection signal V_d. The voltage detected by the voltage detection circuit 261 may correspond to a voltage applied from an external device or generated in the semiconductor memory device 200.

When the temperature in the semiconductor memory device 200 may be higher than the set temperature, the temperature detection circuit 262 may enable a temperature detection signal T_d. The temperature detection circuit 262 may include a temperature sensor.

When the mode signal Self_RF is enabled and any one of the voltage detection signal V_d and the temperature detection signal T_d is enabled, the control signal generation circuit 263 may enable the control signal S_ctrl. When the mode signal Self_RF is disabled or the voltage detection signal V_d and the temperature detection signal T_d are disabled with the mode signal Self_RF being enabled, the control signal generation circuit 263 may disable the control signal S_ctrl.

When the control signal S_ctrl is enabled, the period signal generation circuit 264 may generate the periodically transited period signal S_p. The period signal generation circuit 264 may include an oscillator.

Figure 3:
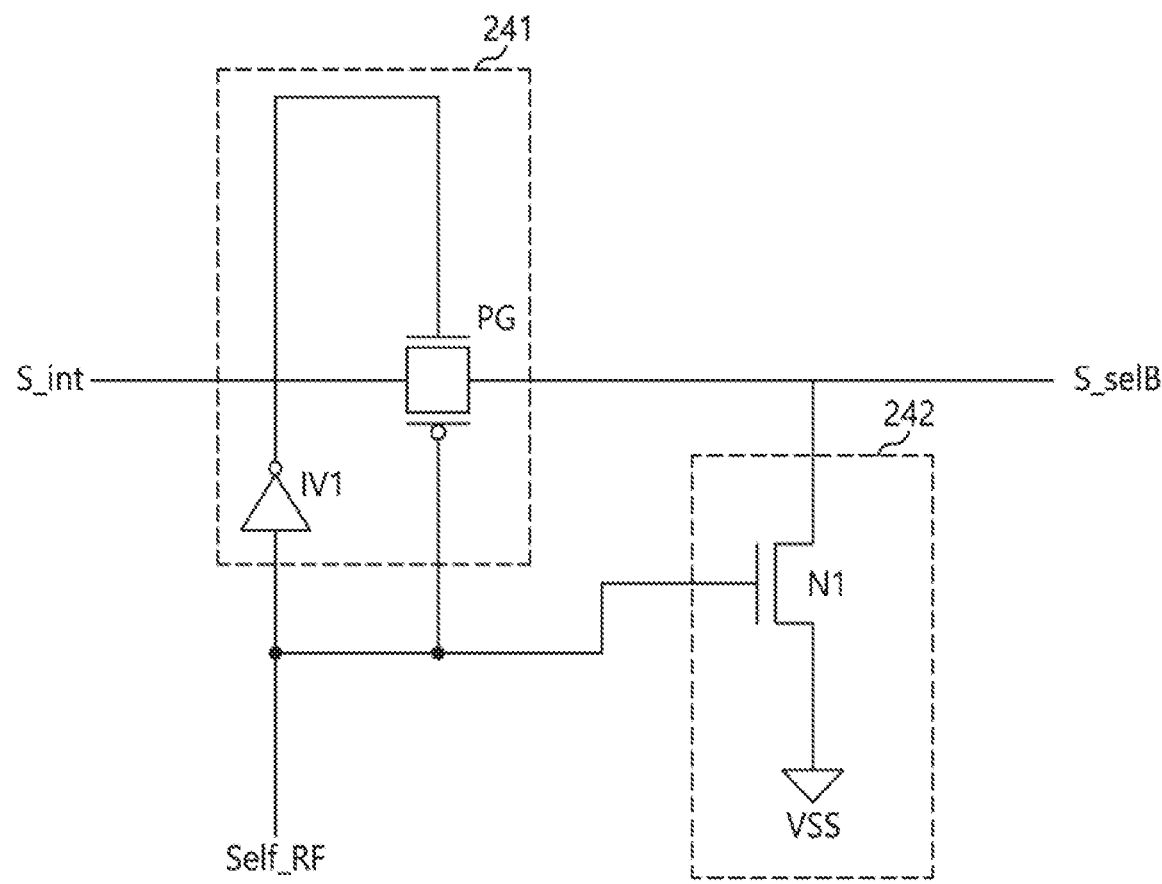
FIG. 3 is a view illustrating a second selection circuit of the semiconductor memory device in FIG. 2.

FIG. 3 is a view illustrating a second selection circuit of the semiconductor memory device in FIG. 2.

Referring to FIG. 3, when the mode signal Self_RF is disabled, the second selection circuit 240 may output the internal signal S_int as the second selection signal S_selB. When the mode signal Self_RF is enabled, the second selection circuit 240 may fix the second selection signal S_selB to the specific level, for example, a low level, regardless of the internal signal S_int.

The second selection circuit 240 may include a switch 241 and a signal level-fixing circuit 242.

When the mode signal Self_RF is disabled, the switch 241 may output the internal signal S_int as the second selection signal S_selB. When the mode signal Self_RF is enabled, the switch 241 may cut off the internal signal S_int as the second selection signal S_selB.

The switch 241 may include a path gate PG and may be configured to perform a first inversion operation. For example, the switch 241 may include a first inverter IV1. The first inverter IV1 may receive the mode signal Self_RF. The path gate PG may include a first control terminal for receiving an output signal from the first inverter IV1, a second control terminal for receiving the mode signal Self_RF, an input terminal for receiving the internal signal S_int, and an output terminal for outputting the second selection signal S_selB.

The signal level-fixing circuit 242 may fix the second selection signal S_selB to the low level when the mode signal Self_RF may be enabled.

The signal level-fixing circuit 242 may include a transistor N1. The transistor N1 may include a gate for receiving the mode signal Self_RF, a drain connected to the output terminal of the path gate PG, and a source connected to a ground terminal VSS. When the mode signal Self_RF is enabled to a high level, the transistor N1 may be turned-on to fix the second selection signal S_selB to the low level.

Figure 4:
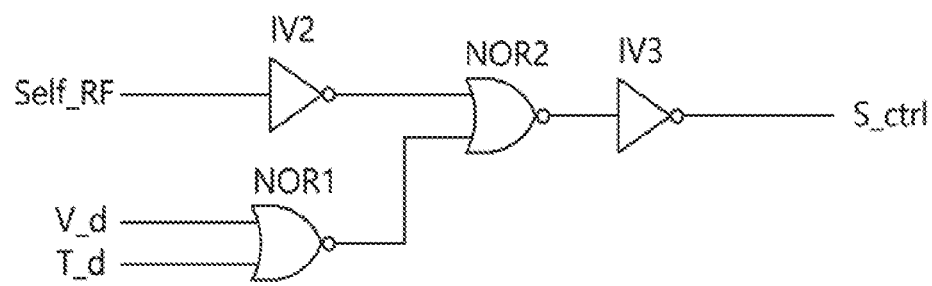
FIG. 4 is a view illustrating a control signal generation circuit of the semiconductor memory device in FIG. 2.

FIG. 4 is a view illustrating a control signal generation circuit of the semiconductor memory device in FIG. 2.

Referring to FIG. 4, when the mode signal Self_RF is enabled to a high level and any one of the voltage detection signal V_d and the temperature detection signal T_d are enabled to a high level, the control signal generation circuit 263 may enable the control signal S_ctrl.

The control signal generation circuit 263 may be configured to perform a second inversion operation, a third inversion operation, a first NOR operation, and a second NOR operation. For example, the control signal generation circuit 263 may include a second inverter IV2, a third inverter IV3, a first NOR gate NOR1 and a second NOR gate NOR2. The second inverter IV2 may receive the mode signal Self_RF. The first NOR gate NOR 1 may receive the voltage detection signal V_d and the temperature detection signal T_d. The second NOR gate NOR2 may receive an output signal from the second inverter IV2 and an output signal from the first NOR gate NOR1. The third inverter IV3 may receive an output signal from the second NOR gate NOR2 to output the control signal S_ctrl.

Hereinafter, operations of the semiconductor memory device 200 may be illustrated in detail.

When the semiconductor memory device 200 does not receive the signals from the controller 100 for a predetermined time, the mode signal Self_RF may correspond to the signal generated in the semiconductor memory device 200 or inputted from the controller 100.

In example embodiments, the semiconductor memory device 200 may correspond to a DRAM and the mode signal Self_RF may correspond to the self-refresh signal. Hereinafter, the mode signal Self_RF may be referred to as the self-refresh signal.

Referring to FIG. 2, when the self-refresh signal Self_RF is disabled, that is, the semiconductor memory device 200 performs a normal operation, not a self-refresh operation, the operation control circuit 260 may disable the control signal S_ctrl.

The first selection circuit 220 may output the buffering signal S_b as the first selection signal S_selA in response to the disabled control signal S_ctrl.

The signal transmission circuit 230 may receive the first selection signal S_selA. The signal transmission circuit 230 may output the first selection signal S_selA as the internal signal S_int.

The second selection circuit 240 may receive the disabled self-refresh signal Self_RF and may transmit the internal signal S_int as the second selection signal S_selB to the core circuit 250.

Therefore, when the semiconductor memory device 200 performs the normal operation, not the self-refresh operation, the command CMD, the address ADD and the data DATA inputted from the controller 100 may be buffered. The buffering signal S_b may be transmitted to the core circuit 250 through the first selection circuit 220, the signal transmission circuit 230 and the second selection circuit 240. Because the signals inputted from the controller 100 may be transmitted to the core circuit 250 in the normal operation, the core circuit 250 may be operated by the controller 100.

In contrast, when the semiconductor memory device 200 performs the self-refresh operation, the self-refresh signal Self_RF may be enabled.

When any one of the voltage detection signal V_d and the temperature detection signal T_d is enabled, the operation control circuit 260 may enable the control signal S_ctrl. When the control signal S_ctrl is enabled, the operation control circuit 260 may generate the period signal S_p.

The first selection circuit 220 may output the period signal as the first selection signal S_selA in response to the enabled control signal S_ctrl.

The signal transmission circuit 230 may receive the first selection signal S_selA and may output the first selection signal S_selA as the internal signal S_int.

The second selection circuit 240 may fix the second selection signal S_selB to a specific level in response to the self-refresh signal Self_RF, regardless of the internal signal S_int. The second selection circuit 240 may output the fixed second selection signal S_selB to the core circuit 250.

When the voltage in the self-refresh operation becomes higher than the set voltage or the temperature in the self-refresh operation becomes higher than the set temperature, the semiconductor memory device may input the period signal S_p in place of the buffering signal S_b as the first selection signal S_selA into the signal transmission circuit 230.

When a voltage becomes higher than a set voltage or a temperature becomes higher than a set temperature, the transistors may be deteriorated. Particularly, when the voltage in the self-refresh operation becomes higher than the set voltage or the temperature in the self-refresh operation becomes higher than the set temperature, the transistors, for receiving the signal fixed to the specific level, may be more deteriorated. Therefore, when the voltage in the self-refresh operation becomes higher than the set voltage or the temperature in the self-refresh operation becomes higher than the set temperature, the semiconductor memory device may input the periodically transited period signal S_p into the signal transmission circuit 230 to reduce the stresses on the transistors in the signal transmission circuit 230.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor memory device comprising:
    a control signal generation circuit configured to generate a control signal in response to a mode signal, a voltage detection signal and a temperature detection signal;
    a period signal generation circuit configured to generate a periodically transited period signal in response to the control signal; and
    a selection circuit configured to output, in response to the control signal, any one of the period signal and a signal from an external device that is buffered.

2. The semiconductor memory device of claim 1, further comprising:
    an input circuit configured to buffer the signal from the external device to output the buffered signal.

3. The semiconductor memory device of claim 1, wherein the control signal generation circuit enables the control signal when the mode signal is enabled and any one of the voltage detection signal and the temperature detection signal is enabled.

4. The semiconductor memory device of claim 3, wherein the control signal generation circuit disables the control signal when the mode signal is disabled, and the control signal generation circuit disables the control signal when the mode signal is enabled and the voltage detection signal and the temperature detection signal are disabled.

5. The semiconductor memory device of claim 3, wherein the period signal generation circuit generates the periodically transited period signal when the control signal is enabled.

6. The semiconductor memory device of claim 3, wherein the selection circuit outputs the buffered signal when the control signal is disabled, and the selection circuit outputs the period signal when the control signal is enabled.

7. The semiconductor memory device of claim 1, further comprising:
    a voltage detection circuit configured to enable the voltage detection signal when a voltage used in the semiconductor memory device becomes higher than a set voltage; and
    a temperature detection circuit configured to enable the temperature detection signal when a temperature in the semiconductor memory device becomes higher than a set temperature.

8. The semiconductor memory device of claim 1, wherein the mode signal comprises a self-refresh signal.

9. A semiconductor memory device comprising:
    a selection circuit configured to output a periodically transited period signal in place of a signal from an external device that is buffered when a voltage in a self-refresh operation is higher than a set voltage and/or a temperature in the self-refresh operation is higher than a set temperature.

10. The semiconductor memory device of claim 9, further comprising:
    an input circuit configured to buffer the signal from the external device to output the buffered signal.

11. The semiconductor memory device of claim 9, wherein the selection circuit outputs the period signal in place of the buffered signal when the voltage in a self-refresh operation becomes higher than the set voltage and/or the temperature in the self-refresh operation becomes higher than the set temperature under a condition that a self-refresh signal is enabled.

12. The semiconductor memory device of claim 11, wherein the selection circuit outputs the buffered signal to the signal transmission circuit when the control signal is disabled, and the selection circuit outputs the period signal to the signal transmission circuit when the control signal is enabled.

13. The semiconductor memory device of claim 12, further comprising an operation control circuit configured to generate the enabled control signal when the voltage in a self-refresh operation becomes higher than the set voltage and/or the temperature in the self-refresh operation becomes higher than the set temperature under the condition that the self-refresh signal is enabled, and configured to generate the period signal when the control signal is enabled.

14. The semiconductor memory device of claim 13, wherein the operation control circuit comprises:
    a voltage detection circuit configured to enable a voltage detection signal when the voltage in the refresh operation becomes higher than the set voltage;
    a temperature detection circuit configured to enable a temperature detection signal when the temperature in the refresh operation becomes higher than the set temperature;
    a control signal generation circuit configured to enable the control signal when the self-refresh signal is enabled and any one of the voltage detection signal and the temperature detection signal is enabled; and
    a period signal generation circuit configured to generate the period signal when the control signal is enabled.

15. An operation control circuit comprising:
    a control signal generation circuit configured to generate a control signal when a voltage in a self-refresh operation is higher than a set voltage and/or a temperature in the self-refresh operation is higher than a set temperature; and
    a period signal generation circuit configured to generate a periodically transited period signal in response to the control signal.

16. The operation control circuit of claim 15, wherein the control signal controls a selection circuit to output the periodically transited period signal in place of a signal from an external device that is buffered.

17. The operation control circuit of claim 15, wherein the control signal generation circuit disables the control signal in a normal operation, and the control signal generation circuit disables the control signal when the voltage detection signal and the temperature detection signal are disabled in a self-refresh operation.

18. The operation control circuit of claim 15, wherein the period signal generation circuit generates the periodically transited period signal when the control signal is enabled.

19. The operation control circuit of claim 16, wherein the selection circuit outputs the buffered signal when the control signal is disabled, and the selection circuit outputs the period signal when the control signal is enabled.

20. The operation control circuit of claim 15, further comprising:

a voltage detection circuit configured to enable the voltage detection signal when the voltage used in the semiconductor memory device becomes higher than the set voltage; and a temperature detection circuit configured to enable the temperature detection signal when the temperature in the semiconductor memory device becomes higher than the set temperature.

* * * * *